United States Patent [19]

Cohen et al.

[11] 4,289,841

[45] Sep. 15, 1981

[54] DRY-DEVELOPING PHOTOSENSITIVE DRY FILM RESIST

[75] Inventors: Abraham B. Cohen, Springfield; Joseph E. Gervay, Red Bank, both of N.J.

[73] Assignee: E. I. Du Pont de Nemours and Company, Wilmington, Del.

[21] Appl. No.: 144,300

[22] Filed: Apr. 28, 1980

Related U.S. Application Data

[63] Continuation of Ser. No. 15,245, Feb. 26, 1978, abandoned.

[51] Int. Cl.³ .................. G03C 11/12; G03C 1/68
[52] U.S. Cl. ..................... 430/253; 430/281; 430/314; 430/323; 430/324; 430/496; 430/905; 430/907; 430/908
[58] Field of Search ............ 430/252, 253, 281, 314, 430/315, 323, 324, 905, 907, 908, 496

[56] References Cited

U.S. PATENT DOCUMENTS

| 3,202,508 | 8/1965  | Heiart        | 96/28      |
|-----------|---------|---------------|------------|
| 3,264,103 | 8/1966  | Cohen et al.  | 96/28      |
| 3,353,955 | 11/1967 | Colgrove      | 96/28      |
| 3,469,982 | 9/1969  | Celeste       | 91/35.1    |
| 3,607,264 | 9/1971  | Celeste       | 96/28      |
| 3,770,438 | 11/1973 | Celeste       | 96/115 P X |
| 4,058,443 | 11/1977 | Murata et al. | 96/35.1 X  |
| 4,127,436 | 11/1978 | Friel         | 96/35.1 X  |

Primary Examiner—Edward C. Kimlin

[57] ABSTRACT

A dry-developing dry film resist is provided comprising a photopolymerizable layer preferably sandwiched between a support sheet and a cover sheet, the layer comprising polymerizable monomer in excess of the absorptive capacity of the layer, photopolymerization initiator, and binder component of a plurality of polymers, at least one of these polymers being incompatible so as to be present as a dispersion in the layer to reduce the cohesive strength of the layer. The layer is developed by peeling away the support sheet, the unexposed area of the layer adhering to the support sheet and the exposed area adhering to the substrate to which it was laminated to form a resist image against such treatments as etching, plating and soldering, especially to make a printed circuit.

10 Claims, No Drawings

DRY-DEVELOPING PHOTOSENSITIVE DRY FILM RESIST

This is a continuation of application Ser. No. 015,245 filed Feb. 26, 1978, now abandoned.

TECHNICAL FIELD

This invention relates to a photosensitive resist material which is capable of dry development to form a resist image on a surface.

BACKGROUND ART

The use of a photopolymerizable dry film as a resist for etching and plating a substrate to form a printed circuit is disclosed in U.S. Pat. No. 3,469,982. Although this use has gained widespread acceptance, it has the disadvantage of requiring "wet" development of the resist image, i.e., the area of photopolymerizable layer that is unexposed in the imagewise photoexposure step, is removed by washing away with solvent which does not dissolve the exposed area of the layer.

Numerous attempts have been made to make a photopolymerizable layer that is developable dry, i.e., the unexposed area of the layer is removed from the exposed area of the layer merely by peeling away of the support sheet, wherein the exposed area of the layer remains on the substrate to which it was laminated and the unexposed area of the layer remains adhered to the support sheet. None of these attempts have been commercially successful. No dry-developing photopolymerizable dry film resist is commercially available.

To detail some of these attempts, U.S. Pat. No. 3,770,438 discloses a dry-developing photopolymerizable layer on a polymer film support operating according to the principle of the polymerizable monomer being present in the layer in a quantity in excess of the absorptive capacity of the binder so that a thin layer of substantially free monomer is present on the surface of the photopolymerizable layer. This free monomer is detectible on the surface of a substrate such as copper as an oily residue when the layer is peeled off of the copper prior to any photoexposure of the layer. The free monomer polymerizes when photoexposed to actinic radiation, to adhere the exposed area of the layer to the copper more strongly than to the film support. The greater affinity of the monomer for the film support than the copper in the unexposed area of the layer enables the unexposed area of the layer to remain adhered to the film support. Different ways for achieving an excess of monomer are used in the patent, e.g., using a hydrocarbon polymer binder and a very large proportion of monomer (77.5% in Ex. 3), using a chlorocarbon polymer binder having a lesser absorptive capacity for the monomer, thereby reducing the monomer content to 40-50% (Ex. 9, 13, 15 & 16), or using a combination of a chlorocarbon polymer (M. wt. about 20,000) and higher molecular weight (about 60,000) poly(methylmethacrylate) to decrease the flow of the layer. The amount of chlorocarbon polymer used ranged from 24.6 to 41.4 by wt., the amount of hydrocarbon polymer ranged from 3 to 29.4% by wt. and the amount of monomer ranged from 24.2 to 65.6% by wt. (Ex. 1, 2, 5–8, 12, 14, and 16). The disadvantage of the dry-developing photopolymerizable layer of this patent was that either the flow of the layer at ordinary room temperature was too great or the fidelity of the image reproduced by the layer was less than desired for the manufacture of printed circuits. As the flow of the photopolymerizable layer was reduced in an attempt to provide a layer that could be supplied in the form of a roll, as required for commercial acceptance, the layer would either not fail cohesively at the boundary between the unexposed area and exposed area of the layer with a smooth, sharp break to give the image fidelity desired or would not fail cohesively at all, i.e., even the unexposed area of the layer would adhere to the substrate when the film support was peeled away. Layers that gave good image fidelity upon dry development were so tacky that it was difficult to remove a coversheet desired to be laminated to a surface of the layer. None of the Examples use a coversheet.

Japanese Patent Publication No. 35,722 published Sept. 28, 1978 discloses earlier Japanese patent publications Nos. 43-22901 and 47-7728; these correspond approximately to U.S. Pat. Nos. 3,353,955 and 3,770,438 (mentioned above), respectively. According to Publication No. 35,722, these earlier publications disclose a dry-developing photopolymerizable layer composed of polymer binder, unsaturated monomer, and photopolymerization initiator, with the properties of the polymer binder, such as molecular weight, softening point, crystallinity, miscibility with other materials, and adhesion towards the substrate as being important properties. Pub. No. 35,722 also discloses that Japanese Patent Publication No. 38-9663 discloses polyvinyl butyral, polyvinylacetate, polyvinylpyrrolidone, gelatin, coumarone indene resin, silicone resin, rubber, etc. and that Pub. No. 47-7728 discloses binder of vinylidene chloride, cellulose ether, synthetic rubber, polyvinyl acetate copolymer, polyacrylate, polyvinylchloride, etc. Pub. No. 35,722 discloses that tests made of photopolymerizable compositions with these binders did not always obtain satisfactory results. Pub. No. 35,722 purports to solve the problem by using a chlorinated polyolefin, disclosing chlorinated polyethylene and chlorinated polypropylene as being preferred, as the polymer binder, in the dry-developing photopolymerizable layer as a plating resist in which the resist is removed after plating and the substrate under the resist is etched.

U.S. Pat. No. 4,058,443 discloses the same background art as referred to in Pub. No. 35,722. U.S. Pat. No. 4,058,443 discloses further that the mechanical strength of photopolymerizable layers used for dry development are apt to have insufficient mechanical strength which is important when the layer is used as a tenting resist. U.S. Pat. No. 4,058,443 purports to solve this problem by having the binder of the photopolymerizable layer, in addition to chlorinated polyolefin, consist of 10 to 90% of a straight-chained polymeric material having sufficient compatibility with the other components of the layer and having a molecular weight of at least 10,000, with a range up to 2,000,000 being disclosed. The chlorinated polyolefin is also claimed to have a polymerization degree of 600 to 20,000 which for chlorinated polypropylene (64% by wt. Cl) corresponds to a molecular weight of about 34,000 to 2,200,000. The resist utility disclosed in this patent is as an etching resist. The layers of this patent are either too flowable or when not too flowable, they have deficient image fidelity upon dry development. In addition, the conditions for peeling away the support film to achieve dry development are too exacting for commercial practice. As such these layers have nothing more than laboratory application.

The need has also arisen for a particular type of dry film photoresist, namely one which is a mask for molten solder and which can remain as a permanent coating on the printed circuit. Such dry film solder mask would offer greater image resolution and fidelity than silk-screen methods now predominantly used. In addition to the usual requirements of dry film photoresist used for plating or etching, the solder mask utility has the additional requirements that the dry film has to encapsulate the exposed surfaces of conductors, withstand the molten solder without embrittlement or loss of adhesion to the printed circuit and without chemical degradation, and be flame retardent, moisture resistant, and a dielectric as well.

Belgian Pat. No. 860,181 granted Apr. 27, 1978 discloses photopolymerizable solder mask compositions provided as a layer sandwiched between a film support and a coversheet. The layer is laminated to a printed circuit by application of heat and pressure and is imagewise exposed and then developed in the same manner as in U.S. Pat. No. 3,469,982, namely by "wet" development to obtain the solder mask (resist image) on the printed circuit. Layer thickness of from 0.0008 cm (0.003 inch) to 0.025 cm (0.01 inch) is disclosed, but all the Examples use a layer thickness of 0.01 cm (0.004 inch) because that was what was required to encapsulate the conductors of the printed circuitry. Conductors were often at least 0.005 cm in height requiring thicker solder mask layers in order to be able to encapsulate the conductors without excessive thinning out of the layer or puncture of the layer by the conductors.

U.S. Pat. No. 4,127,436 discloses a special vacuum lamination process for applying the solder mask to the printed circuit, enabling the thickness of the photopolymerizable layer to be reduced. Example 1 discloses layer thickness of 0.002 inch covering conductors of 0.002 to 0.0044 inch in height. Encapsulation of the conductor by the solder mask is shown in FIG. 3. The solder mask used in this process were wet developed but the concept of dry development is disclosed.

Photopolymerizable solder masks have been commercially available for several years first in the 0.01 cm thickness and eventually in the 0.0075 cm thickness all for development by wet development.

A dry-developing dry film resist having commercial utility would be desirable. To summarize the art discussed hereinbefore, the wet-developing dry film photoresist has achieved commercial utility and so has the wet-developing solder mask. Dry-developing dry film photoresists have been proposed and worked on but have not achieved commercial utility. Dry-developing solder masks have been proposed but without any hint of how to achieve a commercially useful one. The need for a commercially useful dry-developing resist film remains unfulfilled.

DISCLOSURE OF INVENTION

The present invention satisfies the need for a dry-developing dry film resist which has utility on a commercial basis as opposed to mere laboratory utility. The dry film resist can be described as follows: Dry-developing dry film resist for developing am image on a surface by removal of unexposed areas from exposed area of said resist without the use of solvent comprising a flexible support sheet and a photopolymrizable layer having a greater adhesion to said support sheet than to said surface, but upon exposure to actinic radiation, having a greater adhesion to said surface than to said support sheet, said layer comprising a plurality of polymeric binders, at least one of said binders being incompatible so as to be present as a dispersion in said layer to provide an appreciable reduction in the cohesive strength of said layer as compared to when said incompatible binder is not present in said layer, free-radical polymerizable monomer, and photopolymerization initiator for initiating the polymerization of said monomer upon exposure of said layer to actinic radiation, said monomer being present in an amount in excess of the absorptive capacity of said layer, said layer being dry developed by lamination to said surface, imagewise exposure of said layer to actinic radiation to cause the exposed area of said layer to achieve said greater adhesion to said surface, and peeling away said support sheet, the reduced cohesive strength of said layer enabling the unexposed area of said layer to break free from said exposed area and be removed therefrom by said peeling.

The dry film resist of the present invention is especially useful for the demanding utility of a solder mask.

The present invention utilizes the principle of excess monomer of U.S. Pat. No. 3,770,438 but has found that image fidelity does not have to be sacrificed as in this patent and U.S. Pat. No. 4,058,443 when layer flowability is reduced. The present invention provides a measure of decreased flowability, non-tackiness or low enough tack for easy stripping of any coversheet, with high image fidelity by providing a heterogeneous photopolymerizable layer in which a disperse phase of binder polymer is present in the layer. This is in contrast to the compatibility requirement disclosed in U.S. Pat. No. 4,058,443.

The layer is still flowable at elevated laminating temperatures so as to be able to encapsulate the conductors of the printed circuit when used as a solder mask, but the layer has sufficiently low flow at ordinary room temperature (20° C.) that the layer sandwiched between a film support and cover sheet can be rolled up into a tight roll package of at least 50 layers for handling and storage convenience that makes the dry film resist have commercial utility.

Unexpectedly, the dry film resist of the present invention while meeting all the requirements of a solder mask, e.g., resistance to molten solder and moisture resistance without embrittlemenet and being a dielectric, the photopolymerizable layer need be no more than 0.005 cm thick, to cover even higher conductors of a printed circuit. Preferably the layer thickness is no more than 0.0038 cm thick and more preferably to more than 0.0025 cm thick.

Consequently, the solder mask of the present invention provides two important advances over the dry film solder mask commercially available heretofore, namely the elimination of wet development, and the decrease of the layer thickness from 0.0075 cm to no more than 0.005 cm. For the dry film resist utility, in general, the resist of the present invention provides good image fidelity to the original image and sufficient room temperature viscosity (low flow) that the layer can be supplied in roller-up form.

The process of the present invention can be described as follows: A process for selectively modifying a surface, comprising laminating the dry film resist of claim 1 to said surface, imagewise exposing said layer to actinic radiation, removing said support sheet from said surface, whereby the exposed area of said layer remains on said surface and the unexposed area of said layer remains on said support sheet to be removed therewith, treating the resultant exposed area of said surface to modify it, the exposed area of said layer protecting the remainder of said surface from said treating.

FURTHER DESCRIPTION OF INVENTION AND BEST MODE

The present invention will be described in detail with reference to the solder mask utility. It should be recognized, however, that resist which withstands molten solder will also serve as a resist to other deposition of metal such as plating or to etching.

The photopolymerizable layer used in the dry film resist of the present invention is made of binder, monomer, and photoinitiators which bear a certain relationship to each other and to the layer in toto, and these components are combined into the layer in a special way to bring about the dispersed phase of incompatible binder relationship.

To first discuss the layer formulation process, the components are added to solvent being stirred at room temperature. Preferably sufficient solvent is present, i.e., solids concentration is low enough, that the stirring produces a solution of the components, thereby insuring complete mixing thereof. When stirring is stopped, the liquid medium is hazy in appearance. This is best visible to the naked eye when no colorant is in the medium. If excessive solvent is present, some of it will require evaporation before the haze develops.

If the medium is left standing for a still longer time, the haze coalesces to form a stratified separate phase in the medium. It has been found that the amount of incompatible binder present in the composition in the medium, increases (the rate of separation being increased with the help of centrifuging) the amount of stratified separate phase, thereby indicating that the incompatible phase is of incompatible polymer (including a phase at least rich in such polymer).

The solvent for the medium is selected so that the phase separation is not so rapid that stratification occurs before or when the medium is coated on a support sheet and dried to form the photopolymerizable layer. For the composition of Example 1 for example, methylene chloride has been found to be a satisfactory solvent while methyl chloroform and mixtures of cellosolve and methylene chloride are unsatisfactory.

It is not required that the hazy appearance in the liquid medium be seen. It is only required that the dispersed incompatible binder phase forms in the layer during drying.

The dispersed phase is visible in the photopolymerizable layer thrugh a phase contrast microscope for example at about 100X magnification. Several different forms of dispersion have been observed, namely, a dispersion of minute, discrete, spherical-like domains in a continuous phase. The preferred dispersion has the appearance of a mixture of elongated (ribbon-like) domains of different phase with no clear continuous phase. The size of the domains are such that the layer has a hazy appearance which may be visible with the naked eye if the layer is not too deeply colored. The clear visibility of the domains in the microscope indicates the size of the domains are greater than colloidal in size.

The dispersed phase functions in the layer by reducing the cohesive strength of the layer. Cohesive strength is tested by the amount of force needed to peel away the support sheet from the photo-exposed area of the layer adhered to a surface. The force is measured using a tensile strength tester (Instron), and the cohesive strength measured is the force needed to break the thickness of the layer at the boundary between the photo-exposed area of the layer and the unexposed area thereof.

This reduction in cohesive strength of the layer is believed to be caused by the cohesive break occurring along interfaces between the incompatible phases or by fracture of the incompatible phase at the boundary between exposed and unexposed areas. Where the incompatible phase is present as discrete domains in the layer, the presence of these domains shortens the path length of the cohesive failure within the continuous phase of relatively high cohesive strength, from discrete domain to discrete domain to appreciably reduce the cohesive strength of the layer. This requires that the adhesion between the phases is low relative to the cohesive strength of the layer without the incompatible polymeric binder. Preferably, a reduction in cohesive strength of at least 25%, and more preferably at least 50%, and even more preferably at least 75% is obtained, as compared to when no incompatible polymer binder is present, provided that the layer (unexposed area) still has sufficient cohesive strength to be removed from the surface to which it is laminated.

With respect to the composition of the photopolymerizable layer, the plurality of binders are selected to produce the incompatibility hereinbefore described and to impart a relatively no flow condition to the layer at ordinary room temperature (20° C). This incompability results from chemical dissimilarity of the binder polymers and/or differences in molecular weight to produce a lack of affinity of at least one polymeric binder to another polymeric binder of the binder component.

With these criteria in mind, it is apparent that numerous combinations of polymers as the binder component are possible. Preferably, the major proportion, i.e., greater than 50% by wt. of the binder component is chlorine-containing polymer because such polymer also has a limited absorptive capacity for the preferred acrylate polymerizable monomer. Preferably, the weight average molecular weight of all polymeric binders is at least 10,000. Examples of chlorine-containing polymers are polyvinylchloride, polychloroprene, polychlorobutadiene and chlorinated polyolefins such as chlorinated polyethylene, chlorinated polypropylene, and chlorinated polyisoprene. Preferably, the chlorine content of the polymer is at least 40% by weight.

Preferably, the chlorine-containing polymer binder consists of a plurality of such polymers of different molecular weights, selected to include a component of relatively low molecular weight so as to provide good image fidelity and a higher molecular weight component so as to reduce the flow of the layer at ordinary room temperature, which unfortunately also increases the cohesive strength of the layer. By way of example, the low molecular weight range can be from 10,000 to 30,000 weight average molecular weight and the higher molecular weight range can be from 40,000 to 75,000 weight average molecular weight. A preferred combination is chlorinated polyisoprene in the low molecular weight range and chlorinated polypropylene in the higher molecular weight range. The higher molecular weight polymer preferably constitutes from 65 to 90% of the weight of the total chlorine-containing polymer and the low molecular weight chlorine-containing polymer from 10 to 35% of the weight of the total chlorine-containing polymer.

The incompatible polymer can be one or more such polymers. Preferably, the polymer is an organic polymer, which is substantially free of chlorine, more preferably an alkyl acrylate polymer in which the alkyl group contains from 2 to 8 carbon atoms. Polymethylmethacrylate has been found not to produce a dispersed phase in a layer containing the chlorine-containing polymer and not to give the desired image fidelity at a room temperature flow condition which is useful commercially. Examples of poly(alkyl acrylate) polymers are poly(n-butyl methacrylate) preferably having a weight average molecular weight greater than 100,000, a copolymer of 67% by wt. methyl methacrylate/30% by wt. 2-ethyl hexylacrylate/2% methacrylic acid (the alkyl groups average out to an alkyl equivalent of at least 2 carbon atoms), preferably having a weight average molecular weight of 25,000 to 50,000, and poly (ethyl methacrylate), preferably having a weight average molecular weight of at least 100,000. Preferably, the incompatible polymeric binder has a glass transition temperature (Tg), as measured by differential scanning calorimetry, of less than 70° C., which is characteristic of the above-mentioned specific polymers. It is desirable that the incompatible polymer be soluble in solvent which dissolves the other ingredients of the composition used to make the layer.

The proportion of incompatible polymer to total polymeric binder will generally be within the range of 2 to 45% by wt., more often 15 to 35% by wt., depending on the particular polymers present in the polymeric binder in order to get the dispersed phase of incompatible polymer in the layer.

The essential remaining components of the layer are the monomer and photoinitiator. The monomer preferably has at least one terminal ethylenically unsaturated group and is liquid at ordinary room temperature and has a boiling point in excess of 100° C. Examples of monomers include one or more of the following monomers: pentaerythritol triacrylate, trimethylolpropane triacrylate, ethylene glycol diacrylate and dimethacrylate, diethylene glycol diacrylate and other monomers disclosed in U.S. Pat. No. 3,770,438. The amount of monomer present in the layer is an amount in excess of the absorptive capacity of the layer, as indicated by a monomer-rich phase being present on a copper surface to which the layer is laminated and then delaminated (without photoexposure) after letting stand for a reasonable period of time, e.g. two hours. Since the polymer binder component of the layer is the component possessing absorptive capacity for the monomer, then the monomer is present in an amount in excess of the absorptive capacity of the polymeric binder component. Each polymeric binder has its own absorptive capacity for the monomer, so the amount of monomer required will depend on the polymer present as the binder component as well as on the type of monomer. The proportion of incompatible polymer, e.g. should not be so high that while it reduces cohesive strength, it soaks up the excess monomer to cause the exposed image to lose adhesion to the surface to which it is laminated.

Example of photoinitiators include Michler's ketone, benzophenone, 9,10-phenanthrene-quinone, 2-t-butylanthraquinone, and combinations of hexaarylbisimidazoles and leuco dyes. The photoinitiator can consist of one or more components which act separately or in combination to initiate polymerization of the monomer.

The layer preferably contains a plasticizer for one or more of the polymeric binders. Examples of plasticizers include mixed ester of triethylene glycol dicaprate and dicaprylate, chlorinated paraffin and cetyl ether of polyoxyethylenealcohol. The plasticizer increases the elevated temperature flowability of the layer without making the flow at ordinary room temperature too high.

Typically, the photopolymerizable layer will contain from 40 to 65% by wt. polymeric binder, and preferably 45 to 60% by wt.; 35 to 60% by wt. monomer, and preferably 40 to 50% by wt.; 1 to 10% by wt. plasticizer, and preferably 2 to 8% by wt.; and 1 to 10% by wt. of photoinitiator, and preferably 2 to 8% by wt.

Other ingredients can be present in the layer such as an inhibitor of thermally-induced polymerization and a colorant.

The photopolymerizable layer is made into dry film resist by solution blending of the hereinbefore described components, coating the solution onto a support sheet, preferably polyethylene terephthalate which provides dimensional stability to the layer after drying, drying the solution to form a layer on the support sheet, preferably followed by laminating a coversheet, preferably of polyethylene, to the exposed surface of the layer.

The dry layer is of uniform thickness and has sufficient viscosity (no flow) that the layer can be wound up under sufficient tension that the resultant roll does not telescope when held vertically with the core for the roll unsupported. Typically, such roll will have at least 100 layers of photopolymerizable layer and more often at least 300 layers thereof.

In use, the cover sheet is removed and the layer is laminated to the substrate surface desired, usually a printed circuit consisting of a pattern of conductors on a dielectric surface usually of glass-filled thermosetting resin. The lamination is conducted so that the layer flows to encapsulate the conductors without excessive thinning of the layer or puncture of it by the conductors. Next, the layer is imagewise exposed to actinic radiation, with the unexposed area of the layer corresponding to area of the printed circuit where soldering is desired. The next step is to peel away the sheet support, preferably at room temperature, whereby the unexposed area of the layer is removed with it, leaving the exposed area of the layer as a dielectric permanent coating adhering firmly to both the metallic and dielectric areas of the printed circuit. The resultant exposed area of the printed circuit is then contacted with the molten solder (after removal of the support sheet) to coat the exposed area of the printed circuit with solder. This step can be used, e.g., to solder electrical components to the circuit board.

Instead of using the resist as a solder resist, the dry film resist of the present invention can be used as a resist in conventional etching and/or plating operations.

The dry film resists of the present invention provide high circuit line quality (minimal raggedness of line edges), high resolution (ability to develop small solder pad sizes and spaces between resist where solder is to be applied), low peel force, and a wide latitude in peel rate, e.g., 5 to 50 inches/min. at room temperature.

Examples of the present invention are disclosed hereinafter. In these Examples, parts and percents are by weight unless otherwise indicated. Also the acrylate polymer is present in the layer as the dispersed phase.

EXAMPLE I

A photopolymerizable composition was prepared with the following ingredients:

| | |
|---|---|
| Poly(N-Butyl Methacrylate) wt. av. mol. wt. 200,000 | 4g. |
| Chlorinated Polyisoprene, wt. av. mol. wt. 19,000 about 65% by wt. Cl | 12g. |
| Chlorinated Polypropylene, mol. wt. 62,000, about 65% by wt. Cl. | 6g. |
| Mixed ester of triethylene glycol dicaprate and triethylene glycol dicaprylate | 3g. |
| Pentaerythritol triacrylate | 20g. |
| 1,4,4-Trimethyl-2,3-diazobicyclo [3 . 2 . 2] non-2-ene n,n¹-dioxide | 0.025g. |
| Benzophenone | 0.6g. |
| Michler's Ketone | 0.06g. |
| Victoria Green dye | 0.06g. |
| Tris-(4-diethylamino-O-tolyl) methane mol.wt. 499 melt. point 168–170° (leuco dye) | 0.5g. |
| Methylene Chloride | 150g. |

The ingredients were thoroughly mixed for four (4) hours and then coated onto 0.00254 thick transparent polyethylene terephthalate film using a 0.0127 cm coating doctor knife. During coating and drying to a dry thickness of 0.00125 cm, the polyethylene terephthalate film was fastened to a rigid support. When dry, the layer had no room temperature flow such that a coversheet could be laminated to the layer and the resultant sandwich rolled up. This was not done, however, because the layer was being used immediately. Thus, the layer was laminated to a printed circuit board having an epoxy resin-based surface with 0.0050 to 0.0075 cm circuit lines using a hot roll (100° C.) hard rubber roll laminator. The resulting element was then exposed imagewise to a 2,000 watt mercury vapor lamp UV source for 45 seconds through the transparent polyethylene terephthalate support sheet. The photoprinted image was then dry developed by removing the polyethylene terephthalate support sheet by hand peeling at a 180° angle at room temperature, whereby the unexposed areas of the image were removed from the layer by adhering to the support sheet and the exposed areas of the layer were retained on the board to form a solder mask. The printed circuit board with the mask is then cured thermally in an oven for one hour at 150° C., and then run through a wave-solder process at 244° C. using flux. The mask showed excellent adhesion to the copper circuit lines and the epoxy resin surface through the operation. The printed circuit board was then cleaned with a flux-removing solvent, methylchloroform, to leave the solder mask as a permanent flame, chemical, and moisture resistant dielectric photopolymer coating on the board.

The process was repeated using circuit boards having both gold and solder on the surface prior to applying the photopolymer layer. Satisfactory results were obtained in all cases.

This element tested for flammability using UL-94 test procedures exhibited V-O rating under repeated testing.

EXAMPLE II

The same photopolymerizable composition was prepared as in Example I. This was then extrusion coated onto 0.00254 cm polyethylene terephthalate and dried to give a 0.00165 cm photopolymer layer. After this application, a polyethylene coversheet was laminated on the photopolymer to give a sandwich structure. It could then be stored in roll form until use. To forestall long-term sideways flow of the layer, the layer can be edge-hardened by the process disclosed in U.S. Pat. No. 3,867,153. After removal of the protective polyethylene cover sheet, the element was then laminated to the printed circuit board as in Example I and when so tested gave the same results as indicated in Example I.

EXAMPLE III

Results equivalent to Example I were obtained when the copolymer of methyl methacrylate/ethyl hexyl acrylate/methacrylate acid (weight average molecular weight of 30,000 to 40,000) hereinbefore described was substituted for poly(n-butyl methacrylate) on a weight for weight basis.

EXAMPLE IV

A photopolymerizable composition providing similar results was prepared as in Example I except that a high molecular weight soybean oil polyester polymeric epoxide containing 65% oxygen by weight was used as a plasticizer instead of the mixed ester of triethylene glycol dicaprate and triethylene glycol diaprylate.

EXAMPLE V

A photopolymerizable composition was prepared from the following ingredients:

| | |
|---|---|
| Poly(ethyl methacrylate) wt. av. mol. wt. 250,000 | 3g. |
| Chlorinated polyisoprene wt. av. mol. wt. 19,000, about 65% by wt. Cl. | 19g. |
| Mixed ester of triethylene glycol dicaprate and dicaprylate | 3g. |
| Pentaerythritol triacrylate | 20g. |
| Benzophenone | 1.6g. |
| Michler's Ketone | 0.2g. |
| Rhodamine BI base dye | 0.05g. |
| Methylene chlordide | 150g. |

This composition was coated and heat treated as in Example I to produce a solder mask with good room temperature peel-apart properties.

EXAMPLE VI

A satisfactory solder mask formulation was prepared using 0.1 g of benzotriazole in addition to the ingredients in Example V.

EXAMPLE VII

A photopolymerizable composition was prepared with the following ingredients:

| | |
|---|---|
| Poly(n-butyl methacrylate) wt. av. mol. wt. 200,000 | 3.5g. |
| Chlorinated polyisoprene wt. av. mol. wt. 19,000, about 65% by wt. Cl. | 18.5g. |
| Pentaerythritol triacrylate | 20g. |
| Mixed ester of triethylene glycol dicaprate and triehtylene glycol dicaprylate | 3g. |
| 2,2'-methylene bis(4-ethyl-6-tert-butyl phenol) | 0.5g. |
| Benzophenone | 1.6g. |
| Michler's Ketone | 0.2g. |

| | |
|---|---|
| Victoria Green Dye | 0.05g. |
| Methylene Chloride | 150g. |

This composition was coated and heat treated as in Example I to produce a solder mask with good room temperature peel-apart properties.

EXAMPLE VIII

Equivalent solder mask results were obtained when a copolymer of ethylacrylate and n-butyl methacrylate mol. wt. 30,000 to 40,000 was substituted for n-butyl methacrylate in the composition of Example VII.

EXAMPLE IX

Equivalent results for solder mask were obtained when a terpolymer comprising 67% methyl methacrylate/31% 2-ethylhexylacrylate/2% methacrylic acid of mol. wt. 30,000 to 40,000 was substituted for n-butyl methacrylate in the composition for Example VII.

EXAMPLE X

A photopolymerizable composition was prepared with the following ingredients:

| | |
|---|---|
| Terpolymer 65% methyl methacrylate/31% 2-ethyl hexyl acrylate/2% methacrylic acid, wt. av. mol. wt. 30,000 to 40,000 | 4g. |
| Chlorinated polyisoprene wt. av.mol. wt. 20,000, about 70% by wt. Cl. | 18g. |
| Pentaerythritol triacrylate | |
| Mixed ester of triethylene glycol dicaprate and triethylene glycol dicaprylate | 3g. |
| Benzophenone | 1.6g. |
| Michler's Ketone | 0.2g. |
| Victoria Green Dye | 0.05g. |
| Methylene Chloride | 150g. |

The composition was coated and heat treated as in Example I to produce a solder mask with good room temperature peel-apart properties.

EXAMPLE XI

Equivalent solder mask results were obtained when the formulation of Example I was altered by substituting Victoria Pure Blue Dye for Victoria Green and also adding 5 g. of a chlorinated paraffin (60% by wt. Cl.).

EXAMPLE XII

Equivalent solder mask results were obtained when the formulation of Example XI contained 5 g. of cetyl ether of polyoxyethylene alcohol instead of the chlorinated paraffin.

EXAMPLE XIII

A photopolymerizable composition was prepared with the following ingredients:

| | |
|---|---|
| Chlorinated paraffing (70% by wt. Cl.) | 5g. |
| Poly(n-butyl methacrylate) wt. av. mol. wt. 200,000 | 2g. |
| Chlorinated polyisoprene | 14g. |
| wt. av. mol. wt. 19,000, about 65% by wt. Cl. | |
| Chlorinated polypropylene wt. av. mol. wt. 60,000, about 65% by wt. Cl. | 6g. |
| Pentaerythritol tricrylate | 20g. |
| Mixed ester of triethylene glycol dicaprate and triethylene glycol dicaprylate | 3g. |
| 1,4,-Trimethyl-2,3-diazobicyclo [3 · 2 · 2] Non-2-ene N,N'-dioxide | 0.025g. |
| Benzophenone | 1.6g. |
| Michler's Ketone | 0.2g. |
| Victoria Pure Blue Dye | 0.03g. |
| Methylene Chloride | 150g. |

This composition was coated and heat treated as in Example I to produce a solder mask with good room temperature peel-apart properties.

EXAMPLE XIV

This example shows the effect of varying the amount of incompatible polymeric binder in a photopolymerizable layer on the appearance of the dispersion, peel force, and resolution.

A series of solutions of the following photopolymerizable compositions was prepared as in Example I.

| | (wt. in g.) | | | | | | |
|---|---|---|---|---|---|---|---|
| | A | B | C | D | E | F | G |
| $Ch_2Cl_2$ | 265 | 265 | 265 | 265 | 265 | 265 | 265 |
| Leuco Dye | 1.5 | 1.5 | 1.5 | 1.5 | 1.5 | 1.5 | 1.5 |
| Poly(n-butyl methacrylate of Example I | 0 | 3 | 6 | 9 | 12 | 15 | 18 |
| Plasticizer of Example I | 9 | 9 | 9 | 9 | 9 | 9 | 9 |
| Thermal Inhibitor of Example I | 0.075 | 0.075 | 0.075 | 0.075 | 0.075 | 0.075 | 0.075 |
| Victoria Green | 0.18 | 0.18 | 0.18 | 0.18 | 0.18 | 0.18 | 0.18 |
| Benzophenone | 4.8 | 4.8 | 4.8 | 4.8 | 4.8 | 4.8 | 4.8 |
| Michler's Ketone | 0.6 | 0.6 | 0.6 | 0.6 | 0.6 | 0.6 | 0.6 |
| Chlorinated Polyisoprene of Example I | 44 | 42 | 40 | 38 | 36 | 34 | 32 |
| Chlorinated Polypropylene of Example I | 22 | 21 | 20 | 19 | 18 | 17 | 16 |
| Triacrylate Monomer of Example I | 60 | 60 | 60 | 60 | 60 | 60 | 60 |

The solutions were coated onto polyethylene terephthalate film and dried to form a dry layer thickness of 0.00165 cm as in Example I.

1. To observe the dispersed incompatible phase present in the layer, each sample prepared in the preceding paragraph was laminated to a microscope slide and photoexposed as in Example I and then the polyethylene terephthalate film was peeled away leaving the entire photo-exposed layer on the microscope slide. The microscope slide was observed at 106X in a phase contrast microscope. The photo-exposed layer of sample A had the appearance of a single phase. The photo-exposed layer of samples B, C, and D exhibited globules of a second phase dispersed in a continuous phase of increasing amounts (of domains) from sample B to sample D, the size of the domains being similar in all samples. The photo-exposed layer of sample E exhibited a different appearance, namely instead of a dispersion of domains in a continuous phase, the dispersion had the appearance of a dispersion of domains in a dispersion of domains of a different phase, each domain appearing to be ribbon-like in appearance. The photo-exposed layer of samples F and G had the appearance of sample E plus the presence of spherical domains dispersed therein.

2. To measure peel force, a sample of each phase was laminated to clean copper-clad epoxy laminate using a vacuum laminator at a temperature of 100° C. The laminate was sheared into 2.54 cm wide strips. A strip from each sample was photo-exposed as in Example I through a process transparency containing a line target oriented so the lines ran widthwise (perpendicular to the length) of the strip. The strip was clamped in a tensile tester (Instron) and the polyethylene terephthalate support sheet was peeled off lengthwise of the strip, for about one half the length of the strip at a peeling rate of 12.7 cm/min. and the remaining length at a peeling rate of 50.8 cm/min., all at room temperature. The highest force required to peel off the support sheet and thereby develop the image (exposed) on the copper surface, is the force required to achieve cohesive failure (break) at the trailing edge of the exposed image (lines). The forces were as follows:

| Peel Rate (cm/min.) | Sample (peel force (g) along 2.54 cm wide of strip) | | | | | | |
|---|---|---|---|---|---|---|---|
|  | A | B | C | D | E | F | G |
| 12.7 | 120 | 100 | 110 | 40 | 20 | 46 | 50 |
| 50.8 | 60 | 50 | 55 | 32 | 18 | 36 | 40 |

These results show a minimum peel force for both peel rates for sample E, providing a reduction in peel force of greater than 80% as compared to sample A which does not contain any incompatible polymeric binder. These results also show a minimum in peel rate sensitivity for sample E, i.e., the least variation in peel force with changing peel rate. This gives processing latitude to the use of the layer.

3. To measure resolution, a strip of each sample laminated to copper-clad epoxy laminate prepared in the preceding paragraph was photo-exposed as in Example I through a process transparency containing a pattern of opaque dots ranging in diameter from 0.005 to 0.038 cm. The polyethylene terephthalate support sheet was peeled away from the copper surface at a constant peel rate of 50.8 cm/min. to develop the exposed image on the copper surface in which dots of exposed copper surface were then visible. The diameter of the smallest dots of unexposed layer remaining on the support sheet was measured. This experiment was repeated except that a converging line pattern in the process transparency was used and the most closely spaced lines/spaces which were separated in the image resulting from peeling of the support sheet were measured and recorded as follows:

| | Sample | | | | | | |
|---|---|---|---|---|---|---|---|
| | A | B | C | D | E | F | G |
| Dot Resolution (cm) | 0.076 | 0.102 | 0.076 | 0.063/ 0.070 | 0.038/ 0.05 | 0.102/ 0.076 | 0.063 |
| Line Resolution (cm) Line/Space | 0.025/ 0.051 | 0.038/ 0.051 | 0.025 | 0.020/ 0.025 | 0.015/ 0.018 | 0.023/ 0.030 | —/ 0.030 |

Samples F and G suffered from some of the exposed image lines on the copper being lifted off of the copper by the peeling away of the support sheet; this lift-off was severe for sample G. This indicates monomer was not present in excess, having been absorbed by the additional acrylate polymer, whereas adhesion of the exposed areas in this example and the other examples disclosed herein indicates the presence of excess monomer.

4. The solutions prepared as set forth in the first paragraph of this example except for omission of the dyes were centrifuged and the proportion of separate stratified (upper) phase was estimated as follows as a % of the total liquid volume:

| | Sample | | | | | | |
|---|---|---|---|---|---|---|---|
| | A | B | C | D | E | F | G |
| Stratified Phase (%) | 0 | 13 | 20 | 25 | 30 | 40 | 55 |

We claim:

1. Dry-developing dry film resist for developing an image on a surface by removal of unexposed area from exposed area of said resist without the use of solvent comprising a flexible support sheet and a photopolymerizable layer having a greater adhesion to said support than to said surface, but upon exposure to actinic radiation, having a greater adhesion to said surface than to said support sheet, said layer comprising (1) a dispersion of at least one polymer having a Tg below 70° C. in the form of spherical-like domains within a continuous phase of (2) at least one further polymer, the adhesion between the domains of the dispersed polymer and the further polymer being low relative to the cohesion of the continuous phase of second polymer, to provide an appreciable reduction in the cohesive strength of said layer as compared to when the dispersed polymer is not present in said layer, (3) free-radical polymerizable monomer, (4) and photopolymerization initiator for initiating the polymerization of said monomer upon exposure of said layer to actinic radiation, said monomer being present in an amount in excess of the absorptive capacity of said layer, said layer being dry developed by lamination to said surface, imagewise exposure of said layer to actinic radiation to cause the exposed area of said layer to achieve said greater adhesion to said surface, and peeling away said support sheet, the reduced cohesive strength of said layer enabling the unexposed area of said layer to break free from said exposed area and be removed therefrom by said peeling.

2. The dry film resist of claim 1 having sufficient viscosity to be wound up into a tight roll without loss of thickness of said layer.

3. The dry film resist of claims 1 or 2 and additionally a coversheet adhered to the surface of said layer opposite the surface to which said support sheet is adhered, the adhesion of said coversheet to said layer being less than the adhesion of said support sheet to said layer.

4. A tight roll of at least 50 layers of the dry film resist of claim 3.

5. The dry film resist of claim 1 having a thickness up to 0.005 cm.

6. The dry film resist of claim 1 wherein said layer is laminated to said surface which includes copper.

7. A solder mask for dry development of a polymerized image on selected areas of a surface, especially a printed circuit board, to protect said selected areas from molten solder and being capable of also acting as a permanent dielectric coating for said selected areas, comprising a flexible support sheet and a photopolymerizable layer having a greater adhesion to said support sheet than to said surface, but upon exposure to actinic radiation, having a greater adhesion to said surface than to said support sheet, said layer comprising (1) a dispersion of at least one polymer having a Tg below 70° C. in the form of spherical-like domains within a continuous phase of (2) at least one further polymer, the adhesion between the domains of the dispersed polymer and the further polymer being low relative to the cohesion of the continuous phase of second polymer, to provide an appreciable reduction in the cohesive strength of said layer as compared to when the dispersed polymer is not present in said layer, (3) free-radical polymerizable monomer, (4) and photopolymerization initiator for initiating the polymerization of said monomer, said monomer being present in an amount in excess of the absorptive capacity of said layer, the polymerized image on said surface formed by laminating said layer to said surface, image-wise exposing said layer to actinic radiation and peeling away said support sheet to develop said image being resistant to molten solder and a dielectric.

8. The solder mask of claim 7 wherein said incompatible binder is poly(alkyl acrylate) wherein the alkyl group contains from 2 to 8 carbon atoms.

9. The solder mask of claim 7 wherein said monomer is an acrylate monomer.

10. The solder mask of claims 7 and 8 wherein at least one of the other of said polymer binders is a chlorine-containing polymer.

* * * * *